United States Patent [19]

Collombet

[11] Patent Number: 4,652,815
[45] Date of Patent: Mar. 24, 1987

[54] STATE LOGIC TESTING DEVICE FOR A LOGIC CIRCUIT

[75] Inventor: Michel Collombet, Grenoble, France

[73] Assignees: Commissariat a l'Energie Atomique; Framatome & Cie; Merlin Gerin, all of France

[21] Appl. No.: 472,055

[22] Filed: Mar. 4, 1983

[30] Foreign Application Priority Data

Mar. 5, 1982 [FR] France ................. 82 03711

[51] Int. Cl.[4] ............ G01R 15/12; G01R 19/14; G01R 31/02
[52] U.S. Cl. ................. 324/73 R; 324/133; 324/51
[58] Field of Search .......... 324/73 R, 73 AT, 73 PC, 324/133, 51, 158 R; 340/640, 641, 653, 514-516; 364/550, 551; 371/15

[56] References Cited
U.S. PATENT DOCUMENTS 3,524,178 8/1970 Stratton ................. 324/133
4,045,726 8/1977 Schweitzer, Jr. ........ 324/133

Primary Examiner—Ernest F. Karlsen
Assistant Examiner—Walter E. Snow
Attorney, Agent, or Firm—Handal & Morofsky

[57] ABSTRACT

A logic system of the type which has means for applying two-state logic testing signals to an input of a logic circuit to be tested is disclosed. A logic circuit to be tested has two output logic states. The system comprises control means for applying control signals having two logic states to the input of the logic circuit to be tested. The value of the two output logic states is dependent respectively on two input logic states of the control signals applied to the input of the logic circuit to be tested. Override means imposes each logic state of the test signals on the input of the logic circuit to be tested, independent of the logic state of the control signals.

11 Claims, 4 Drawing Figures

STATE LOGIC TESTING DEVICE FOR A LOGIC CIRCUIT

BACKGROUND OF THE INVENTION

The present invention relates to a device for applying two-state logic testing signals to an input of a logic circuit. The invention more particularly applies to the testing of a logic circuit, whereof one output supplies signals, whose logic states are dependent on the logic states of control signals applied to one of their inputs by a control means. Without it being necessary to disconnect the control means from the logic circuit to which it is connected, it makes it possible to impose testing signals on the input of said logic circuit in such a way as to be able to check the resulting signals at the output, no matter what the logic state of the signals simultaneously supplied by the control means. The device is more particularly intended for use in the testing of logic circuits making it possible to initiate urgent actions in nuclear reactors, on the basis of logic signals supplied by control means constituted by transducers, whose outputs supply control signals of the "all or nothing" type, said control signals having in fact logic states 1 or 0.

The invention is also applicable to the automatic testing of a plurality of logic circuits, by test signals having two logic states applied to the inputs of said circuits, without it being necessary to disconnect these circuits from the control means applying logic signals to their inputs.

At present, no testing device is known, which makes it possible to apply logic testing signals to the input of a logic circuit controlled by a control means, without having to disconnect said means from the logic circuit. Generally, when it is necessary to test a logic circuit by applying test signals to one input thereof, in order to observe at the output the corresponding resultant signals the control means is disconnected from the logic circuit, in such a way that the control signals do not disturb the test signals and conversely the test signals do not disturb the operation of the control means. The main disadvantage of disconnecting the control means from the logic circuit is that there is a doubt regarding the transmission of the control signals to the logic circuit when, with the test completed, the control means is again connected to the logic circuit. Thus, during said connection and after a test, faulty contacts may occur in the connection of the output of the control means to the input of the logic circuit.

BRIEF SUMMARY OF THE INVENTION

The problem of the present invention is to obviate these disadvantages and in particular aims at providing a device making it possible to apply two-state logic testing signals to an input of a logic circuit, without it being necessary for the performance of this test to disconnect the control means of the logic circuit and without the test signals disturbing the control means and without the control signals disturbing the test signals. As a result of the device according to the invention, the test signals are forced to the control input of the logic circuit. The device also makes it possible to automatically test a plurality of logic circuits, without disconnecting these circuits from their control means.

The invention therefore specifically relates to a device for applying two-state logic testing signals to an input of a logic circuit, the latter supplying at an output, signals having two logic states dependent respectively on two logic states of control signals applied to its input by an output of a control means, wherein it comprises means for imposing each logic state of the test signals on the input of the logic circuit, no matter what the logic state of the control signals.

According to another feature of the invention, the means for imposing each logic state (0 or 1) of the test signals on the input of the logic circuit, comprise an electric power source having a positive terminal and a negative terminal, the latter being connected to a reference earth, the potentials of the positive and negative terminals of the power supply respectively representing logic 1 and 0, and means for connecting the input of the logic circuit to the positive terminal of the power supply, whenever a test signal of logic state 1 has to be applied to said input for connecting the input of the logic circuit to the reference earth and for preventing the application of the potential of the positive terminal of the power supply to the input of the circuit, whenever a test signal having a logic state 0 has to be applied to the input of the logic circuit.

According to a first embodiment of the invention, the means for connecting the input of the circuit to the positive terminal of the power supply comprise a resistor connected between the input of the logic circuit and the positive terminal of the power supply, the means for connecting the input of the circuit to the reference earth and for preventing the application of the potential of the positive terminal comprise a switch connected between the input of the circuit and the reference earth, the opening or closing of said switch respectively corresponding to logic states 1 and 0 of the test signal, and another resistor connected in series between the input of the logic circuit and the output of the control means.

According to another feature of this in connection with this first embodiment, the device also comprises at least one diode connected in series with one of the two resistors.

According to another feature in connection with the first embodiment, the resistors and diodes are permanently connected to the input of the logic circuit, the power supply as well as the switch being detachable and only being respectively connected to the resistor and to the input of the circuit at the time of a test.

According to a second embodiment of the invention, the means for connecting the input of the circuit to the positive terminal of the power supply and for connecting it to the reference earth and for precwnting power output from the power supply, comprise a resistor connected to the positive terminal of the supply and to a first terminal of a two-position switch, said first terminal corresponding to the first position, the switch having a second terminal corresponding to the second position and which is connected to the reference earth, and a terminal common to both positions, connected to the input of the circuit, the first position corresponding to the application of a test signal having logic state 1 and the second position corresponding to the application of a test signal having logic state 0, and a further resistor connected between the input of the logic circuit and the output of the control means.

According to another feature in connection with this second embodiment, the device also comprises a diode connected between the input of the logic circuit and the output of the control means.

According to another feature in connection with this second embodiment, the resistor, the switch and the power supply are detachable, the diode and the other resistor being permanently connected to the input of the logic circuit.

According to yet another feature, the control means is a transducer, whose output supplies signals of the all or nothing type (logic states 1 or 0).

Finally, the device according to the invention is applicable to the automatic testing of a plurality of logic circuits by test signals having two logic states applied to the inputs of these circuits.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
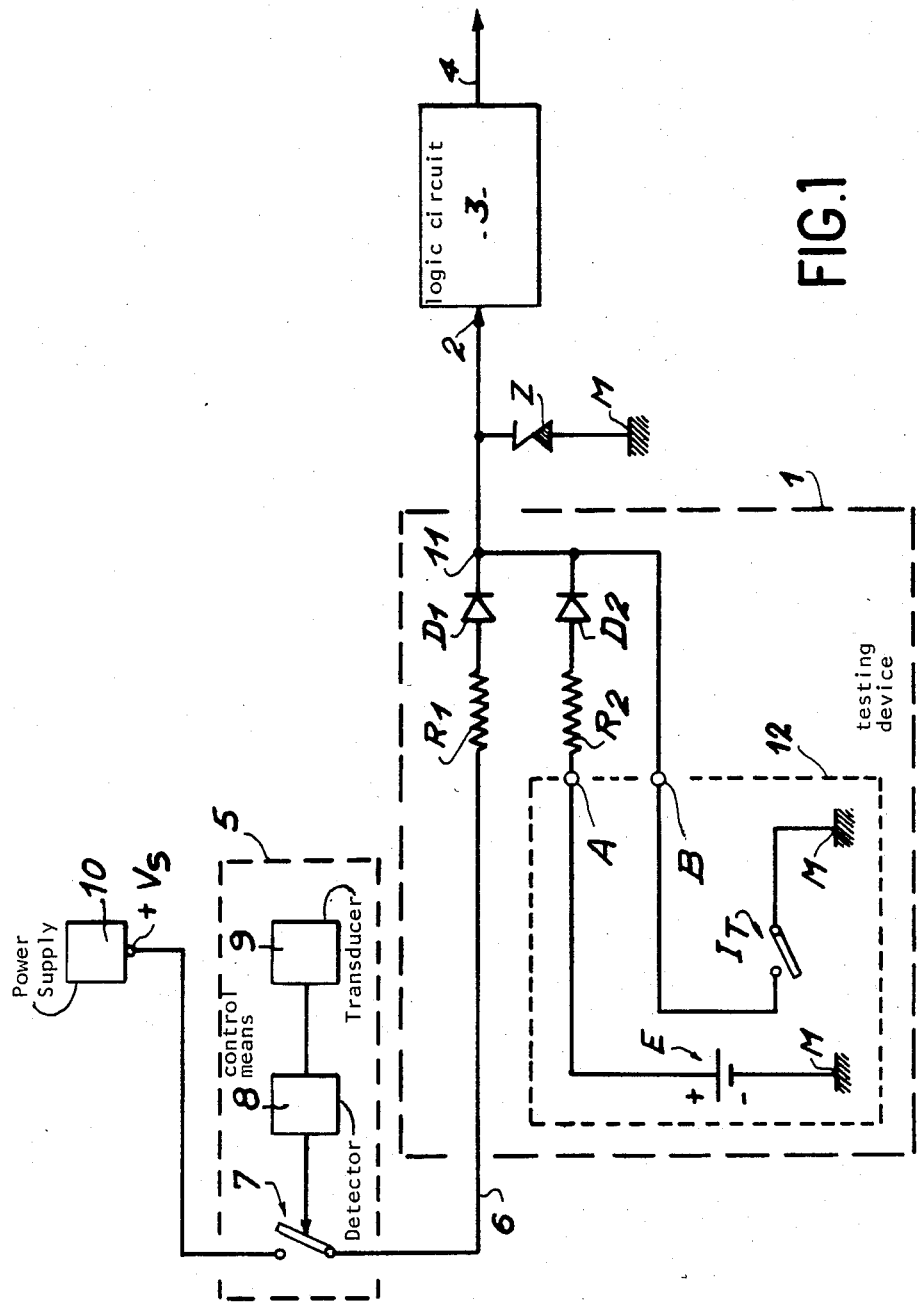
FIG. 1 diagrammatically, a first embodiment of a device according to the invention.

FIG. 1 diagrammatically shows a first embodiment of a testing device 1 according to the invention. This device makes it possible to apply logic test signals having two states 0 and 1 to an input 2 of a logic circuit 3. This logic circuit supplies at an output 4, signals having two logic states, dependent respectively on the two logic states of the control signals applied to its input 2. These control signals have logic states of 1 or 0 and are supplied by the output of a control means 5 which can be e.g. a threshold transducer diagrammatically represented in the drawing by a controllable switch 7, receiving control signals from a threshold detector 8, itself connected to a transducer 9 which is sensitive to the variations of a physical phenomenon. On exceeding a voltage threshold at the output of transducer 9, the threshold detector 8 can, for example, control the closing of switch 7, in such a way that the output 6 of the control means has a voltage equal to the output voltage +VS of an electric power supply 10. Voltage +VS can be considered as representing a logic state 1 at output 6 of control means 5. When switch 7 is open, output 6 of means 5 is at the potential of reference earth M, which can be considered as representing logic state 0. It is obvious that the control means 5 which, in the present embodiment, is considered to be a threshold transducer associated with a controllable switch 7, could be constituted by any other circuit, whose output supplies all or nothing control signals, i.e. signals with logic states 0 or 1. The testing device 1 according to the invention comprises means making it possible to force or impose each logic state on the test signals (logic states 0 or 1) on input 2 of logic circuit 3, no matter what the logic state of the control signals at the output 6 of control means 5. Means 1 making it possible to impose test signals of logic states 1 or 0 on input 2 of logic circuit 3, in fact comprise in the first and second embodiments of the invention, a power supply E substantially equal to voltage +VS, which has a positive terminal and a negative terminal. The negative terminal is connected to a reference earth M and the potentials of the positive and negative terminals of power supply E respectively represent logic states 1 and 0. The means making it possible to impose each logic state of the input of logic circuit 3 also comprises means which will be described in greater detail hereinafter and which make it possible to connect input 2 of logic circuit 3 to the positive terminal of supply E, whenever a test signal having a logic state 1 has to be applied to the input of this logic circuit. These means also make it possible to connect the input of the logic circuit to the reference earth to prevent the application of the potential of the positive terminal of the supply to the input of the circuit, whenever a test signal of logic state 0 has to be applied to the input of this circuit.

In the first embodiment of the device according to the invention, the means which make it possible to connect input 2 of the circuit to the positive terminal of power supply E comprise a resistor $R_2$, whereof a first terminal is connected to the anode of a diode $D_2$, the cathode of said diode being connected to the input 2 of logic circuit 3. A second terminal A of resistor $R_2$ is connected to the positive terminal of power supply E. The means making it possible to connect the input of logic circuit 3 to the reference earth M and which make it possible to prevent the application of the potential of the positive terminal of supply E to the input of said circuit comprise a switch $I_T$ connected between input 2 of circuit 3 and reference earth M. As will be shown in greater detail hereinafter, the opening or closing of switch $I_T$ respectively corresponds to logic states 1 or 0 of the test signals to be applied to the input 2 of circuit 3.

In this embodiment, the device according to the invention also comprises another resistor $R_1$ connected in series with another diode $D_1$, between input 2 of logic circuit 3 and output 6 of control means 5, the cathode of diode $D_1$ being connected to the input 2 of the logic circuit.

This drawing also shows a Zener diode Z connected between the common point 11 of the cathodes of diodes $D_1$ and $D_2$ and reference earth M. This Zener diode, which is not indispensable, makes it possible in certain special applications to supply a voltage of constant level to logic circuit 3.

The operation of the device will be better understood by means of the following table, which represents the open or closed position of which 7, the logic state of the signals at output 6 of the control means 5, as well as at the input 2 of logic circuit and then, during the test, the open or closed position of switch $I_T$, as well as the corresponding logic states of the test signals at the input 2 of logic circuit 3.

| Positions of switch 7 | Logic states of control signals (output 6 and input 2) | Positions of test switch $I_T$ | Logic states of signals at input 2 |
|---|---|---|---|
| Open | 0 | Open | 1 |
|  |  | Closed | 0 |
| Closed | 1 | Open | 1 |
|  |  | Closed | 0 |

When switch 7 of control means 5 is in the open position, output 6 is in logic state 0, which is at input 2 of logic circuit 3. However, if the test signal $I_T$ is open, the voltage of the positive terminal of supply 3 is at the common point 11 of the cathodes of diodes $D_1$ and $D_2$. This positive voltage corresponds to logic state 1 and input 2 of logic circuit 3. Thus, in this case, although the logic state of the signals at output 6 of control means 5 is 0, the testing device imposes logic state 1 on input 2 of logic circuit 3.

If switch $I_T$ is now in the closed position whilst switch 7 of control means 5 is still in the open position, the current supplied by power supply E circulates in resistor $R_2$ to earth M. Thus, the cathode of diode $D_2$ is at the potential of this earth, so that the voltage at the common point 11 of the cathodes of diodes $D_1$ and $D_2$ is equal to the potential of earth M. In this case, the logic state of the signal applied to the input of logic circuit 3 is 0.

If switch 7 of control means 5 is now in the closed position, the potential $+VS$ of power supply 10 is located at output 6 of control means 5 and said output is consequently in logic state 1. In the absence of a test, this logic state normally occurs at input 2 of logic circuit 3.

If switch $I_T$ is in the open position, the potential of the positive terminal of power supply E is located on the anode of diode $D_1$. Thus, point 11 is at a potential equal to the highest of the potential values of supply E and potential $+VS$. This potential corresponds to logic state 1 and consequently to the logic state of the control signal supplied at output 6 of control means 5. Conversely, if the test switch $I_T$ is in the closed position, the current supplied by power supply E circulates in resistor $R_2$ in the direction of earth M and a current also circulates in resistor $R_1$, which absorbs the potential difference between points 6 and 11. The common point 11 of the cathodes of diodes $D_1$ and $D_2$ is at the potential of earth M corresponding to logic state 0. In this case, whilst the control signal supplied by output 6 of control means 5 is in logic state 1, the signal at input 2 of logic circuit 3 is at logic state 0, said logic state being imposed by the said testing device.

Thus, the testing device makes it possible to impose logic states of the test signals on the input of logic circuit 3, no matter what the logic state of the signal supplied at the output 6 of control means 5.

In order to facilitate testing, particularly in the case where a plurality of logic circuits, like circuit 3, are respectively connected to the output of control means, like control means 5, resistors $R_1$, $R_2$ and diodes $D_1$, $D_2$ are permanently connected to the output of control means 5, the control signals of logic circuit 3 being available at the common point 11 of the cathodes of diodes $D_1$ and $D_2$. The power supply E, as well as switch $I_T$ are detachable (as represented by the rectangle 12) and are only connected to points A and B at the time when a logic circuit is to be tested. Rectangle 12 can be a box containing the indicated components and connected to earth M.

Diodes $D_1$ and $D_2$ make it possible to prevent the passage of currents, particularly during a test, either in the direction of power supply E from power supply 10, or in the direction of power supply 10 from power supply E.

The device described hereinbefore makes it possible to achieve the aforementioned objectives. It makes it possible to test a logic circuit by test signals applied to its input, without it being necessary to disconnect this logic circuit from the control means applying control signals to this input. It also makes it possible to impose the logic state of the test signals, no matter what the logic state of the control signals. This device is particularly intended for testing logic circuits for making it possible to actuate safety means in nuclear power stations. Thus, it is indispensable that the logic circuits can be rapidly tested, without it being necessary to disconnect them from their control means, because any disconnection for testing purposes, followed by a connection after the test, can lead to faulty contacts prejudicial to the safety of the power station.

The device described hereinbefore is certainly an aid to safety when operating safety equipment in nuclear power stations. Thus, the triggering of an action by means of logic circuit 3 takes place through the application of a signal of logic state 1 to input 2 of circuit 3. When the detachable elements 12 of the device are connected at A and B, a signal of logic state 1 is necessarily applied to input 2 of circuit 3, no matter whether switch 7 is in the open or closed position. Switch $I_T$ is a switch, whose normal position is open, in the absence of any closing control.

Figure 2:
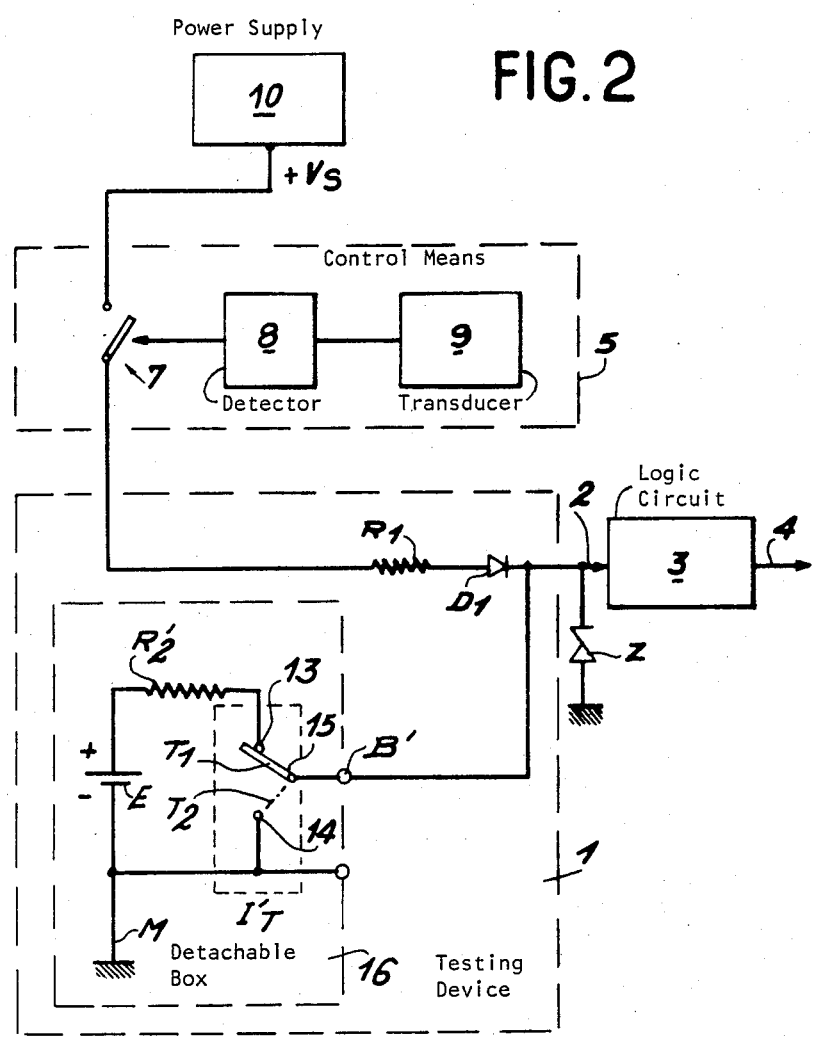
FIG. 2 diagrammatically, a second embodiment of a device according to the invention.

FIG. 2 diagrammatically shows another embodiment of the device according to the invention. The same elements carry the same references in FIG. 2 as in FIG. 1.

In this embodiment, the means for connecting input 2 of circuit 3 to the positive terminal of power supply E, for connecting this input to the reference earth and for preventing the application of the potential of the positive terminal of power supply E, comprise a resistor $R'_2$ connected to the positive terminal of supply E and to a first terminal 13 of a two-position switch $I'_T$. Resistor $R'_2$ can be replaced by a diode. This first diode corresponds to a first position of the switch, which also comprises a second terminal 14, corresponding to a second position, said second terminal being connected to a reference earth M. One terminal 15 of this switch is common to the two positions thereof and it is connected to input 2 of circuit 3. The first position of the switch corresponds to the application of a test signal having logic state 1 to the input 2 of the circuit, whilst the second position of the switch corresponds to the application of a test signal of logic state 0 to the said input.

In this embodiment, the device also comprises a resistor $R_1$ connected in series with a diode $D_1$ between the input of logic circuit 3 and the output 6 of control means 5, the cathode of diode $D_1$ being connected to the input of this logic circuit. The control means 5 is not described in detail, because it is constructed in the same way as that described in FIG. 1. As in the previous embodiment, a Zener diode Z connects the input 2 of circuit 3 to earth M.

The operation of the device will be better understood from the following table, which shows the open or closed positions of switch 7, the logic state of the signals at the output 6 of control means 5 and at the input 2 of logic circuit 3 and during these tests, the two positions of switch $I'_T$ together with the corresponding logic states of the test signals at the input of logic circuit 3. The two positions of switch $I'_2$ are respectively designated $T_1$ and $T_2$.

TABLE

| Positions of switch 7 | Logic states of the control signals (output 6 and input 2) | Positions of the test switch $I'_T$ | Logic states of the signals at input 2 |
|---|---|---|---|
| Open | 0 | $T_1$ | 1 |
|  |  | $T_2$ | 0 |
| Closed | 1 | $T_1$ | 1 |
|  |  | $T_2$ | 0 |

When switch 7 of the control means 5 is in the open position, output 6 is in logic state 0, which is at input 1 of logic circuit 3 if switch $I'_T$ is in position $T_2$. Thus, in this case, power supply E is not connected to input 2 of circuit 3. Conversely, if switch $I'_T$ is in position $T_1$, supply E is connected to input 2, via resistor $R'_2$ and a test signal of logic state 1 is applied to the input of circuit 3, even if the signal of control means 5 is in logic state 0.

If switch 7 of control means 5 is closed, with switch $I'_T$ in position $T_1$, control means 5 applies a control signal of logic state 1 to input 2 of circuit 3, whilst switch $I'_T$ also applies a test signal of logic state 1 to the same input of logic circuit 3. Conversely, if the control signal applied to input 2 of circuit 3 is a signal of logic state 1 (switch 7 closed) and switch $I'_T$ is in position $T_2$, source E is no longer connected to input 2 of the circuit and the control circuit 5 is connected to reference earth M, across the resistor $R_1$ and diode $D_2$. Thus, in this case, the signal applied to input 2 of logic circuit 3 is a signal of logic state 0, although the control signal is in logic state 1.

Resistor $R'_2$ is necessary for ensuring that power supply E does not feed into 10, or at least limits the feed thereto. It is also necessary as a result of Zener diode Z.

Thus, the testing device makes it possible to impose the logic states of the test signals on the input of logic circuit 3, no matter what the logic state of the signal supplied to output 6 of control means 5. As in the preceding embodiment, particularly in the case where the plurality of logic circuits such as circuit 3 are respectively connected to the output of the control means such as means 5, resistor R', switch $I'_T$ and power supply E are detachable, e.g. contained in the same box 16, which is itself connected to earth M. Resistor $R_1$, as well as diode $D_1$, are permanently connected to input 2 of circuit 3. Detachable box 16 is only connected to point B' at the time when it is necessary to test a logic circuit. As in the preceding embodiment, a Zener diode Z connects input 2 of circuit 3 to reference earth, in order that the voltage level (for logic state 1) applied to said logic circuit for controlling it or at the time of the test is constant.

Figure 3:
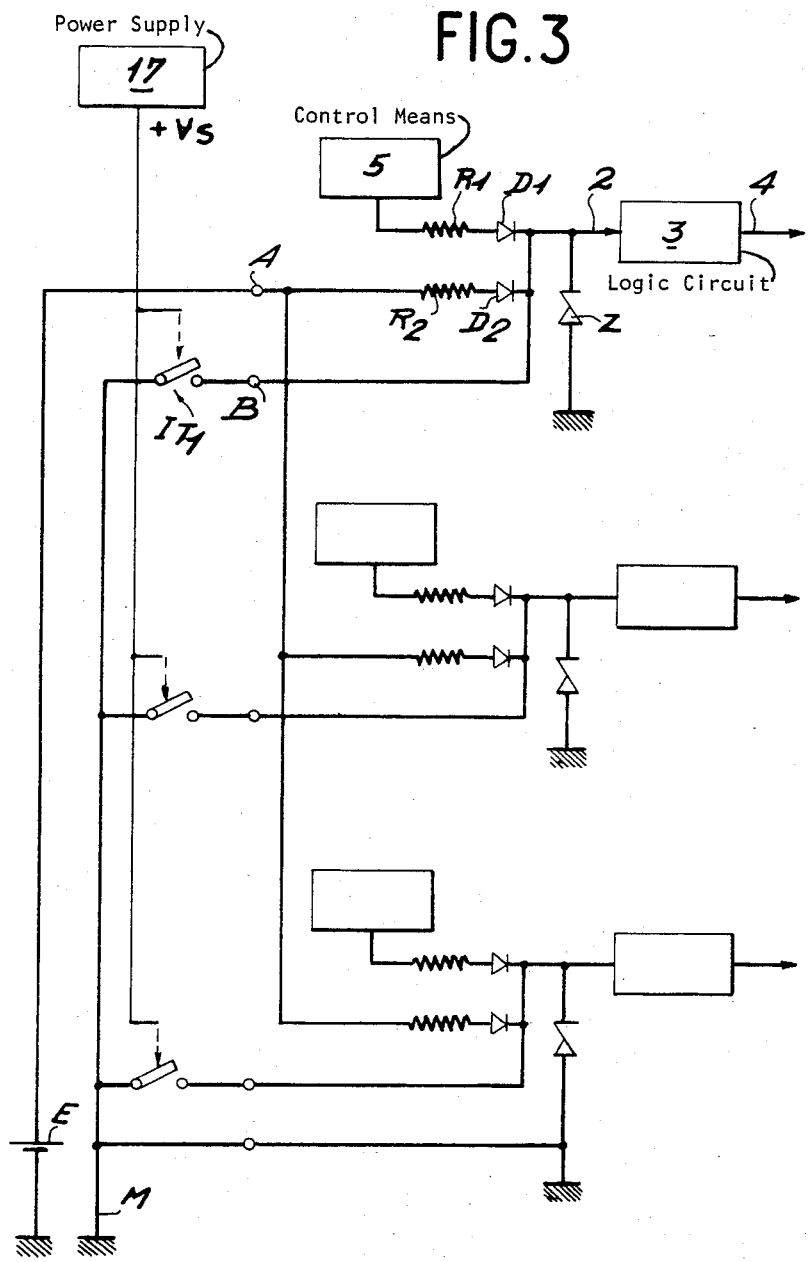
FIG. 3a diagram showing the application of the first embodiment of the device through the automatic testing of a plurality of logic circuits.

FIG. 3 diagrammatically shows the application of the first embodiment of the device according to the invention to the automatic testing of a plurality of logic circuits, like logic circuit 3, whereof output 4 supplies signals having two logic states depending respectively on the two logic states of control signals applied to its input 2. The same elements carry the same references in FIG. 3 as in FIG. 1 and the control means 5 are not shown in detail here.

In the application of the device to the automatic testing of logic circuits like circuit 3, a switch $I_{T1}$ is necessary for linking each circuit 3 with earth M. Switches $I_{T1}$ are controlled by a sequencer 17, which is not shown in detail here. This sequencer makes it possible to control the closing of switches $I_{T1}$ as a function of the logic states of the test signals applied to the input of the circuit which is to be tested. Switches $I_{T1}$ are assumed to be electrically controllable switches. A single connection with power supply E is necessary and is adequate for testing all the circuits in random configurations. Only switches $I_{T1}$ are necessary.

Figure 4:
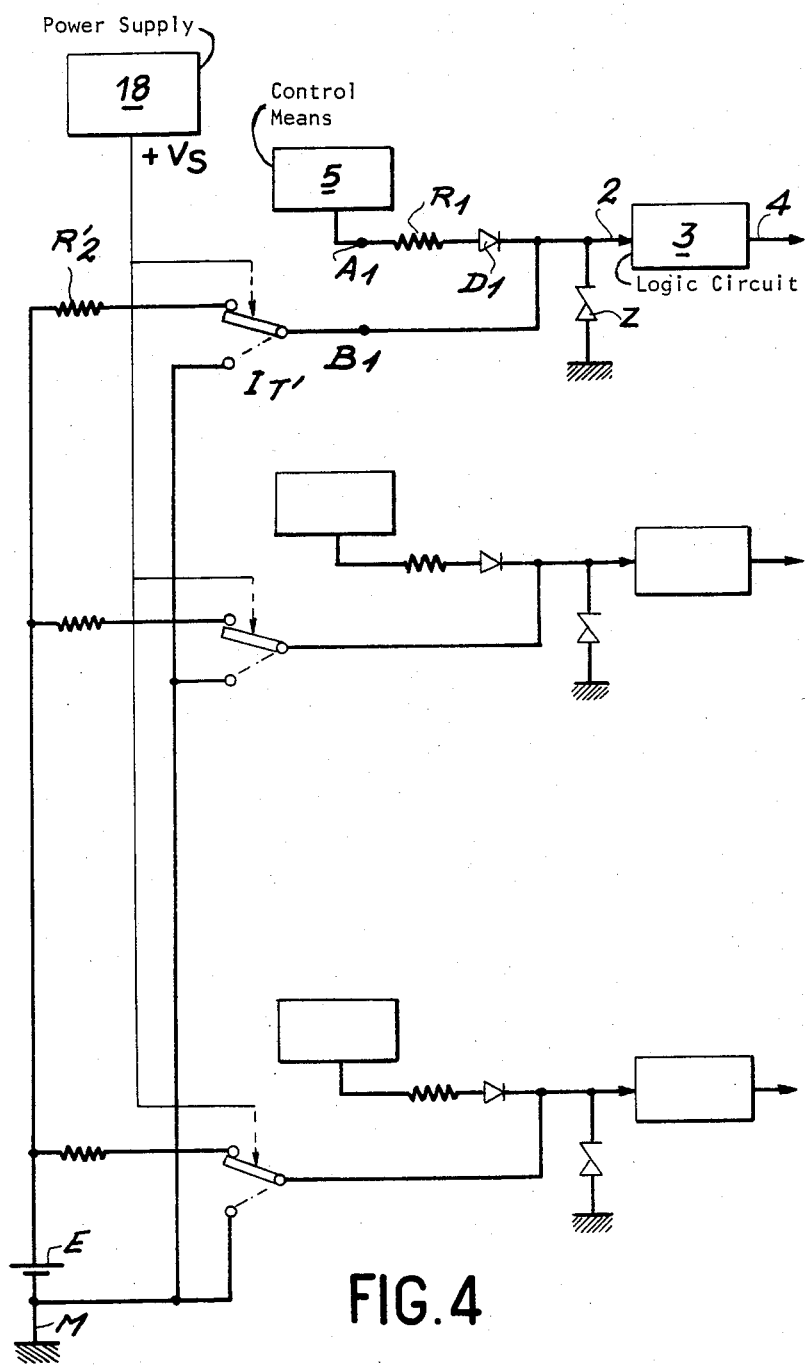
FIG. 4a diagram showing the application of the second embodiment of the device to the automatic testing of a plurality of logic circuits.

FIG. 4 diagrammatically shows an application of the second embodiment of the device for the automatic testing of a plurality of logic circuits. The same elements carry the same references in FIG. 4 as in FIG. 2.

The device according to the second embodiment can be applied to the testing of logic circuits, like circuit 2. The control means 5 of each of these logic circuits are not shown in detail here. Switches $I'_T$ are connected on the one hand to power supply E via resistors $R'_2$ and on the other to the reference earth M. A sequencer 18 can make it possible to automatically control the testing of each of the circuits. In this case, it is assumed that the two-positions switches $I'_T$ are electrically controlled switches said control not being shown in detail here.

It is obvious that in the device according to the invention, the means used could be replaced be equivalent means without passing beyond the scope of the invention.

What is claimed is:

1. A logic system of the type which has means for applying two-state logic testing signals to an input of a logic circuit to be tested, said logic circuit to be tested having an output and supplying at said output, signals having two output logic states, said system comprising control means for applying control signals having two logic states to the input of said logic circuit to be tested, the value of said two output logic states being dependent respectively on two input logic states of said control signals applied to the input of said logic circuit to be tested and wherein said means for applying two state logic testing signals comprises override means for imposing each logic state of the test signals on the input of the logic circuit to be tested, independent of the logic state of the control signals.

2. A device according to claim 1, wherein the override means for imposing each logic state (0 or 1) of the test signals on the input of the logic circuit to be tested, comprises an electric power source having a positive terminal and a negative terminal, the latter being connected to a reference ground, the potentials of the positive and negative terminals of the power supply, respectively, representing logic 1 and 0, means for connecting the input of the logic circuit to be tested to the positive terminal of the power supply, whenever a test signal of logic state 1 has to be applied to said input for connecting the input of the logic circuit to be tested to the reference ground and for preventing the application of the potential of the positive terminal of the power supply to the input of the logic circuit to be tested, whenever a test signal having a logic state 0 has to be applied to the input of the logic circuit to be tested.

3. A device according to claim 2, wherein the means for connecting the input of the logic circuit to be tested to the positive terminal of the power supply comprises a resistor connected between the input of the logic circuit to be tested and the positive terminal of the power supply, the means for connecting the input of the logic circuit to be tested to the reference ground and for preventing the application of the potential of the positive terminal comprise a switch connected between the input of the logic circuit to be tested and the reference ground, the opening or closing of said switch respectively corresponding to logic states 1 and 0 of the test signal, and another resistor connected in series between the input of the logic circuit to be tested and the output of the control means.

4. A device according to claim 3, wherein it comprises at least one diode connected in series with the resistor which is connected to the positive terminal of the power supply, or with the resistor which is connected to the output of the control means.

5. A device according to claim 3, wherein the diodes and resistors are permanently connected to the input of the logic circuit, the electric power supply and the switch being detachable and are only respectively connected to the resistor and to the input of the circuit at the time of the test.

6. A device according to claim 2, wherein the means for connecting the input of the logic circuit to be tested to the positive terminal of the power supply and for connecting it to the reference ground and for preventing power output from the power supply, comprises a resistor connected to the positive terminal of the supply and to a first terminal of a two position switch, said first terminal corresponding to the first position, the switch having a second terminal corresponding to the second position and which is connected to the reference ground, and a terminal common to both positions, connected to the input of the logic circuit to be tested, the first position corresponding to the application of a test signal having logic state 1 and the second position corresponding to the application of a test signal having logic state 0, and a further resistor connected between the input of the logic circuit to be tested and the output of the control means.

7. A device according to claim 6, wherein it also comprises a diode connected in series with the resistor which is connected to the output of the control means, the cathode of said diode being connected to the input of the logic circuit to be tested.

8. A device according to claim 7, wherein the resistor connected to the positive terminal, the switch and the power supply are detachable, said diode and the other resistor which is connected to the output of the control means being permanently connected to the input of the logic circuit to be tested.

9. A device according to claim 1, wherein the control means is a transducer, whose output supplies signals of the all or nothing type (logic states 1 or 0).

10. A device according to claim 6, wherein the resistor, the switch and the power supply are detachable, the diode and the other resistor being permanently connected to the input of the logic circuit to be tested.

11. In combination, a logic circuit to be tested, having an output and supplying at said output signals having two output logic states, control means for applying control signals representing physical phenomena and having two logic states to the input of said logic circuit to be tested, the value of said two output logic states being dependent respectively on two input logic states of said control signals applied to the input of said logic circuit to be tested, and override means for imposing each logic state of the test signals on the input of the logic circuit to be tested, independent of the logic state of the control signals, said override means comprising an electric power source having a positive terminal and a negative terminal, the latter being connected to a reference ground, the potentials of the positive and negative terminals of the power supply, respectively, representing logic 1 and 0, and means for connectivg the input of the logic circuit to be tested to the positive terminal of the power supply, whenever a test signal of logic state 1 has to be applied to said input for connecting the input of the logic circuit to be tested to the reference ground and for preventing the application of the potential of the positive terminal of the power supply to the input of the circuit to be tested, whenever a test signal having a logic state 0 has to be applied to the input of the logic circuit to be tested.

* * * * *